United States Patent [19]

Reed

[11] 4,211,603

[45] Jul. 8, 1980

[54] MULTILAYER CIRCUIT BOARD CONSTRUCTION AND METHOD

[75] Inventor: Douglas A. Reed, Tigard, Oreg.

[73] Assignee: Tektronix, Inc., Beaverton, Oreg.

[21] Appl. No.: 901,904

[22] Filed: May 1, 1978

[51] Int. Cl.² ............................................. C23F 1/02
[52] U.S. Cl. .............................. 156/659.1; 29/852; 156/656; 156/902; 174/68.5; 427/97; 428/901; 430/319
[58] Field of Search .................. 174/68.5; 29/625; 427/96–99; 96/36.2, 38.4; 156/629–634, 654–656, 659–661, 901, 902; 428/901

[56] References Cited

U.S. PATENT DOCUMENTS

| | | | |
|---|---|---|---|
| 3,317,408 | 5/1967 | Barnes et al. | 156/644 X |
| 3,322,881 | 5/1967 | Schneble et al. | 427/98 X |
| 3,934,335 | 1/1976 | Nelson | 427/96 X |

Primary Examiner—William A. Powell
Attorney, Agent, or Firm—John D. Winkelman

[57] ABSTRACT

Multilayer circuit boards having large area through-hole electrical connections are provided by a process that begins with the fabrication by known means of a drilled and through-hole plated single layer board. Next, a layer of insulating material is applied to either side of the board, leaving at least the through-hole plating exposed. A continuous layer of metal is then deposited on the body, completely covering the insulating layer and through-hole plating. Finally, the deposited metal layer is selectively masked and etched to form conductive circuit patterns on the insulating layer, overlying the original circuit patterns and electrically connected to them by the multiple layer through-hole plating.

7 Claims, 10 Drawing Figures

MULTILAYER CIRCUIT BOARD CONSTRUCTION AND METHOD

BACKGROUND OF THE INVENTION

The present invention relates to electrical circuit boards, and in particular to improved multilayer circuit board constructions and methods.

Multilayer "printed" circuit boards are widely used, and a number of different methods for making them are known in the art. Standard industry practice is to laminate a number of single layer circuit boards together, after which their metallic conductor patterns are selectively interconnected. Typically, the constituent single layer boards are bonded together using intermediate layers of an adhesive material and the application of heat and pressure. Then, after holes are drilled through the laminated structure at predetermined points, the hole walls are metal plated to interconnect the various circuit patterns electrically.

Other known multilayer circuit board fabrication processes include those shown and described in U.S. Pat. Nos. 3,464,855; 3,691,632; 3,791,858; 3,934,355 and 4,030,190.

In U.S. Pat. No. 3,464,855 to Shaheen et al., solid metal interconnections are formed between the different circuit patterns in a multilayer structure. The process described involves adhering a removable insulating mask to a circuit board overlying a conductor pattern of the board. Openings in the mask define the locations of desired interconnections between that pattern and another one to be provided subsequently. The mask openings are filled with metal, after which the removable mask is replaced with a permanent insulating layer. Only the top surfaces of the metal interconnecting members remain exposed for connection to the metal pattern subsequently formed on the insulating layer. The process is repeated as desired to form additional layers.

U.S. Pat. No. 3,691,632 to Smith concerns a variation of the perviously-mentioned industry standard method. The metal conductor patterns on an undrilled double-sided circuit board are covered with continuous layers of an insulating material. Additional metal conductor patterns are then formed on the insulating layers, and the insulation/metal pattern sequence is repeated as necessary to provide the total number of layers desired. Holes are drilled through the assembly at selected locations, intersecting the metal conductor patterns, after which metal is plated in the hole bores to interconnect the patterns electrically.

In U.S. Pat. No. 3,791,858 to McPherson et al., a multilayer process using additive techniques for forming the conductors within and between each circuit pattern layer is disclosed. The conductors are built up by metal deposition through photosensitive masks that are removed subsequently and replaced with fluid dielectric curable to solid form. Multiple layers are formed by successively repeating the process.

Another additive multilayer fabrication process is disclosed in U.S. Pat. No. 3,934,355 to Nelson. A suitable substrate is coated with a photo-polymerizable material that is exposed to light to form a dielectric layer on the substrate. A conductor pattern is formed on the dielectric layer by first image-wise exposing a photosensitve sensitizing coating applied to the layer, then electrolessly plating metal on the exposed areas. Additional layers are formed in a similar manner, windows being provided in subsequent dielectric layers for interconnection of the different conductor patterns.

U.S. Pat. No. 4,030,190 to Varker describes the construction of multilayer circuit boards by a method that begins with the lamination of dielectric material to the opposite sides of a metal base sheet. Metal conductor patterns are formed on the dielectric layers, after which additional layers of dielectric material are laminated onto the patterns. Vias for interconnection of the conductor patterns with ones subsequently formed are opened in the latter-mentioned dielectric layers by laser drilling.

Several disadvantages attend these and other prior art multilayer circuit board methods and constructions. For example, as board size and complexity increase it becomes more and more difficult to maintain good registration between the various layers in a laminated structure. The subsequently drilled and metal plated interconnection holes may not intercept the overlaid circuit patterns properly if the different layers are misregistered. Depending on the degree of misalignment, electrical short circuits, opens, and high resistance interconnections can result. Smearing of the laminate dielectric during the hole drilling process can partially or completely cover the edges of the metal conductor patterns, forming insulating barriers between the patterns and the subsequently deposited through-hole plating.

A further significant disadvantage of standard multilayer processes is the small area of the electrical connections formed between the circuit patterns and hole plating, even when the previously mentioned problems are avoided. At best, each pattern is joined to the through-hole plating by a narrow annulus of metal the same thickness as the pattern. Because of this, process irregularities can very significantly affect board reliability and yield. The problem of small area interconnections has been addressed previously by the provision of solid metal post-like connections between layers, as exemplified by the earlier mentioned patents to Shaheen et al., McPherson et al. and Varker. While satisfactory for certain uses, processes that produce only solid interlayer connections are unsuitable for most multilayer board applications, which utilize throughholes for attaching wire leads, mounting components etc. Since such holes must be provided in any event, it is a significant advantage to be able to connect different circuit patterns electrically at the through-holes. It is accordingly evident that a need exists for an improved multilayer circuit board fabrication method providing large area through-hole interlayer electrical connections.

SUMMARY OF THE INVENTION

The present invention provides a method for making multilayer circuit boards that begins with the fabrication by conventional means of a drilled and through-hole plated single layer board, either single- or double-sided. Next, in accordance with a first illustrated embodiment, a coating of an insulating material is applied to one or both major surfaces of the board, completely covering the metal circuit patterns but leaving the through-hole plating exposed. A continuous layer of metal is then deposited on the insulating coating and through-hole plating. Finally, the deposited metal layer is selectively masked and etched to form conductive circuit patterns on the insulating coating, overlying the original patterns and electrically connected to them by the metal plating in the through-hole bores. Additional circuit layers are produced as required by repeating the steps of coating the outermost major surfaces of the board with insulating material, depositing a continuous metal layer on the insulating coating and through-hole bore plating, and selectively removing portions of the deposited metal layer.

According to a second illustrated embodiment, a pattern layer of insulating material is formed on each major surface of a drilled and through-hole plated single layer board, leaving both the holes and surrounding pad areas of the underlying metal circuit patterns exposed. Next, a continuous metal layer is deposited on the outer surfaces of the board, covering the insulating layer pattern, circuit pads and through-hole plating. Conductive circuit patterns are then formed overlying the existing patterns by selectively removing portions of the deposited metal layer. Additional circuit layers may be produced by forming alternating insulating and conductive pattern layers in the same manner.

Large area through-hole electrical connections are provided by both embodiments of the invention. The first-described process has the advantage of simplicity and low cost, since the intercircuit insulation is formed as a substantially continuous coating rather than as a registered pattern layer. The second embodiment provides larger area, more reliable through-hole interconnections and allows solid metal electrical connections to be made between layers as well.

DESCRIPTION OF PREFERRED EMBODIMENTS

Figure 1:
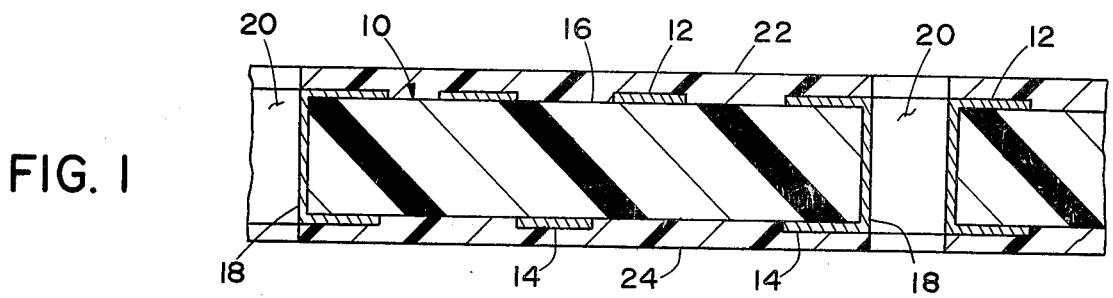
FIGS. 1 through 4 are partial cross-sectional views representing various phases in the fabrication of a multilayer circuit board in accordance with a first embodiment of the invention.

Referring to FIG. 1, the manufacture of a multilayer electrical circuit board according to one embodiment of the invention begins with the fabrication by known procedures of a single layer circuit board 10. Board 10 includes a pair of electrical conductor patterns 12, 14 formed on the opposite faces of a suitable insulative substrate 16. Patterns 12, 14 are interconnected at appropriate locations by metal sleeves 18 lining bores (or "through-holes") 20. The manner in which circuit board 10 is formed is not relevant to the present invention, and any known methods may be used. For example, the opposite sides of a copper-clad epoxy-glass laminate may be selectively etched to provide conductor patterns 12, 14. Then, after holes 20 are drilled or punched through the laminate at appropriate locations, the hole walls are copper plated to form interconnecting sleeves 18.

The next step in the process comprises coating both major surfaces of circuit board 10 with a suitable dielectric material to form substantially continuous insulating layers 22, 24 covering patterns 12, 14 respectively, but leaving through-holes 20 open. The dielectric material is chosen with a view to the method of application used and the mechanical and electrical requirements of the insulating layers. Suitable materials include uncured liquid organic resin compositions of the type ordinarily used to form solder mask layers. Exemplary compositions available commercially include Wornow SR1001 and Lonco 33RX, both heat-curable epoxies, and 3M 1301, a UV-curable epoxy. Roller coating is the preferred method of application because of its simplicity and low cost. The thickness of the cured layers is principally determined by electrical requirements, such as voltage withstand. Thickness in typical multilayer board applications range from about 2.2 to about 4.0 mils (1 mil=0.001 in.).

Figure 2:
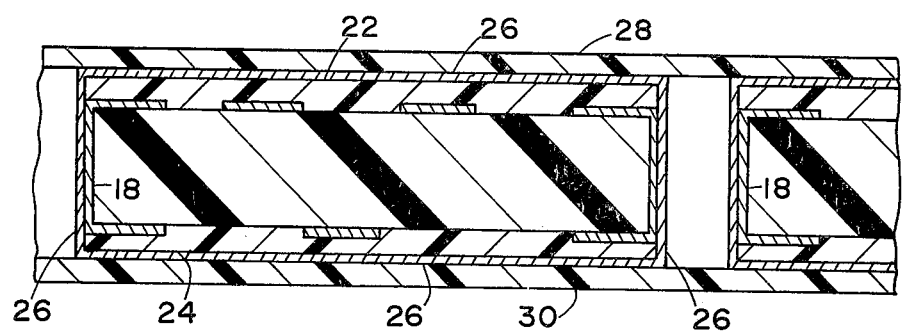

Now referring to FIG. 2, the exposed surfaces of insulating layers 22, 24 and sleeves 18 next are plated with a continuous layer 26 of a conductive metal, normally copper. Metal layer 26 can be formed completely by electroless deposition using well-known methods, or a thin film can be deposited electrolessly and then built up to the desired thickness by electroplating. To prevent peeling and assure maximum adhesion to the insulating layers, the substrate is treated by immersion in a chrome etch solution (such as Shipley PM-930) prior to the metal deposition procedure. Other known surface preparation treatments, e.g., plasma etching, can be used instead. Following the plating step, films 28, 30 of a photosensitive resist are applied to the opposite sides of the substrate, covering the openings of through-holes 20 as shown. The photo-resist preferably is one of the types available in "dry" sheet form, such as Dynachem "Laminar AX" or DuPont "Riston". Dry film resists have a tacky surface and can be adhered directly to the metal plating by mechanical lamination.

Figure 3A:
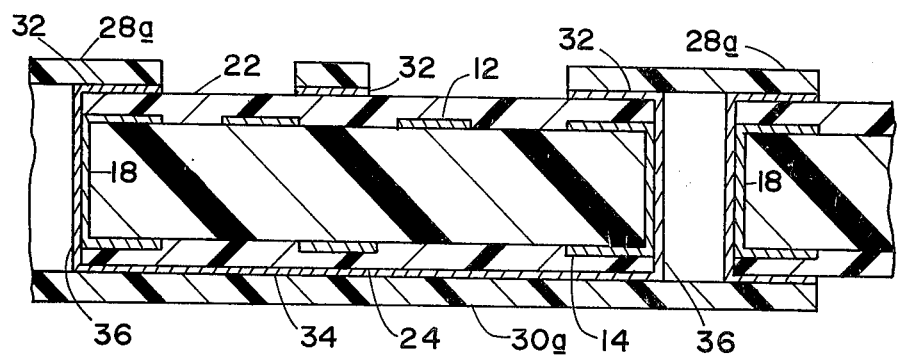

The photo-resist films are selectively exposed to ultraviolet light or other actinic radiation to harden the areas that are to remain in place during subsequent processing. Treatment with a developer for the resist dissolves the unexposed areas of films 28 and 30, exposing portions of underlying metal layer 26. The exposed metal is then removed with a chemical etchant to form conductor patterns 32, 34 (FIG. 3a) on insulating layers 22, 24 respectively. Patterns 32, 34 are electrically interconnected with underlying patterns 12, 14 by metal sleeves 36 formed by the portions of metal layer 26 lining the plated through-holes. The remaining portions 28a, 30a of the resist films are chemically stripped from the newly-formed patterns to complete the formation of a multilayer circuit board structure according to the invention. Additional circuit layers may be added as required by repeating the above-described sequence of coating one or both major surfaces of the board with an insulating material, leaving the through-holes open; depositing a continuous layer of metal on the insulating coating and through-hole plating; and forming a conductive circuit pattern on the insulating coating by removing selected portions of the metal layer.

Figure 3B:
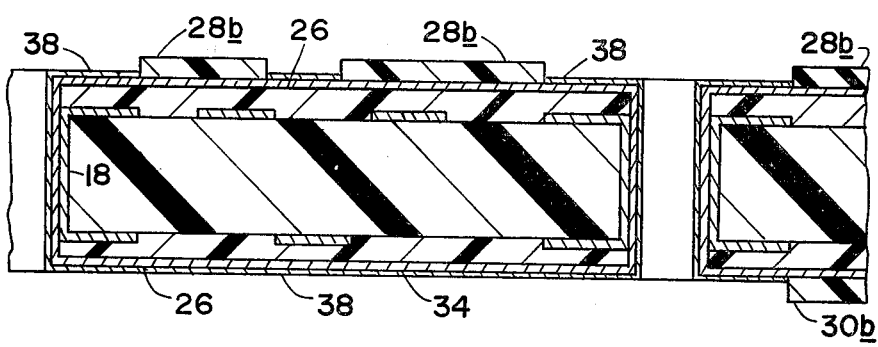
Figure 4:
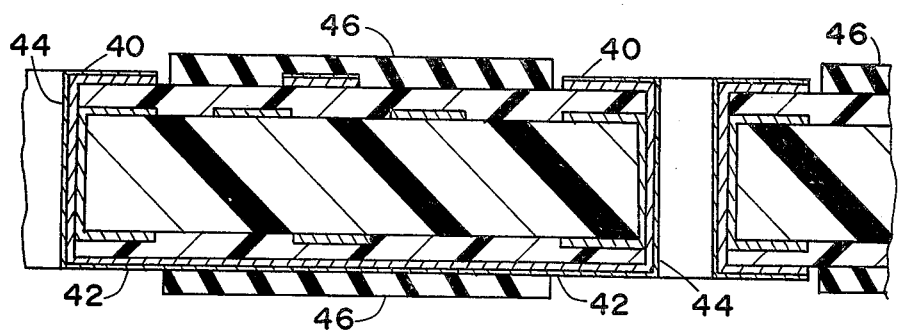

As mentioned above, the metal forming the added circuit patterns typically will be copper. For the outermost circuit layers, it is desirable to overlay the exposed copper with a metal having better oxidation and corrosion resistance, such as gold or tin. This is suitably accomplished by the following variation of the above described process. Beginning with the structure shown in FIG. 2, photo-resist films 28, 30 are exposed to patterns of light corresponding to the negatives of the desired conductor patterns, thus hardening the resist overlying those portions of metal layer 26 that later are to be removed. After developing the photo-resist films, the exposed areas of layer 26 are placed with a protective metal overlay 38 (FIG. 3b). The choice of protective material is determined using criteria well understood in the art. By way of example, however, a suitable overlay may consist of about 0.3 mils tin over a nickel base about 0.15 mils thick. Next, photo-resist deposits 28b, 30b are stripped off and the substrate is subjected to an etching process. All of layer 26 is removed by the etchant except for the portions covered by overlay 38, which serves as an etch resist. The resulting conductor patterns 40, 42 (FIG. 4) and the metal sleeves 44 interconnecting them thereby include a protective metal overlay for good solderability and extended shelf life. Finally, a solder mask 46 is screened on both sides of the board to cover the areas not to be soldered.

Figure 5:
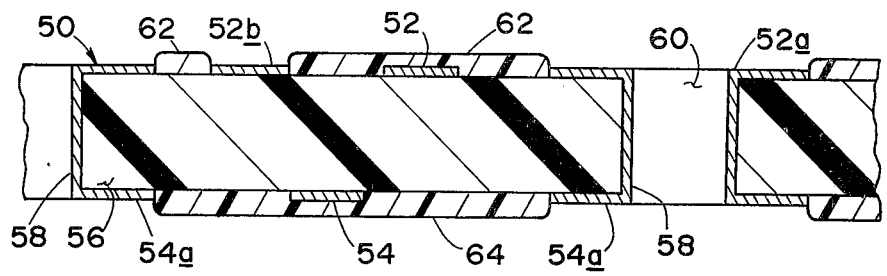
FIGS. 5 through 9 similarly represent various phases in the fabrication of a multilayer board according to a second embodiment of the present invention.

An alternative procedure for manufacturing multilayer circuit boards in accordance with the invention likewise begins with a conventional single layer board. Referring to FIG. 5, such a board 50 includes first and second metal circuit patterns 52, 54 on the opposite faces of a substrate 56, interconnected by metal sleeves 58 lining through-holes 60. First and second patterned layers 62, 64 of a suitable dielectric, or insulating, material are printed on board 50 overlying patterns 52, 54 respectively. As shown in the figure, through-holes 60 and their surrounding pad areas 52a, 54a are left exposed to associate in the formation of large area interconnections with subsequently-provided circuit patterns. Other areas of the original metal patterns, e.g. area 52b, are left uncovered to provide additional connections to later-formed circuit patterns on the same sides of the board. Insulating layers 62, 64 may be printed on board 50 in a variety of ways, but screen stencil printing of a solder mask composition, such as the previously-mentioned Wornow SR-1001 or the like, is the preferred method. As in the earlier-described embodiment, the insulating layers typically have a thickness of about 2.2 to 4.0 mils after curing. It may be necessary, and it is usually preferable, to screen on several coatings to achieve such thicknesses.

Figure 6:
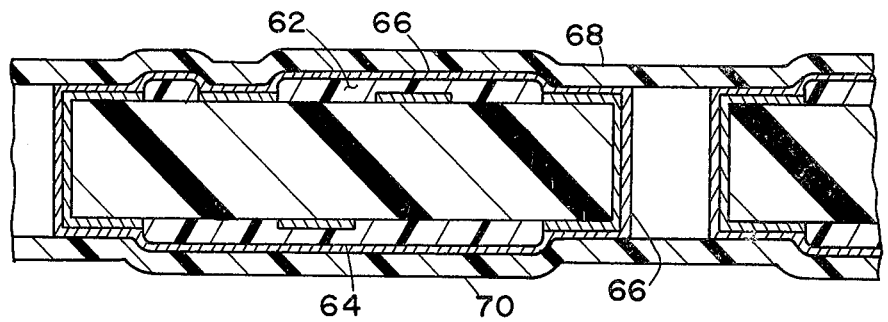
Figure 7:
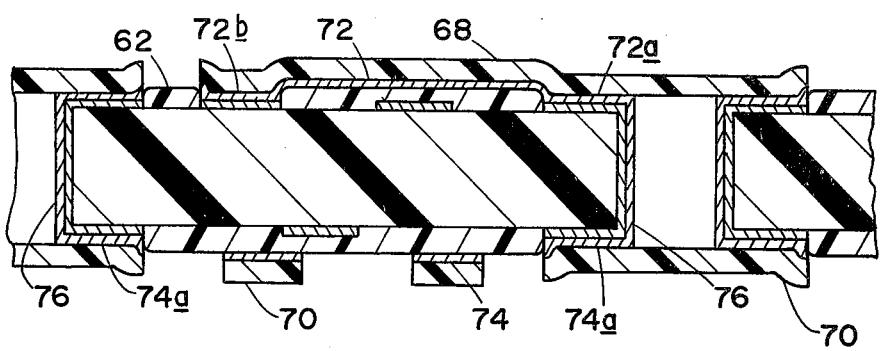

Next, additional conductive circuit patterns are formed on either face of the FIG. 5 structure using one of the methods described previously. Thus, for example, a continuous layer 66 (FIG. 6) of copper is plated on the structure, completely covering insulating layers 62, 64, the exposed portions of circuit patterns 52, 54, and the inner surfaces of sleeves 58. Films 68, 70 of a dry photoresist material are then laminated onto the opposite sides of the metal plated substrate, exposed to positive light images corresponding to the desired metal patterns, and developed to remove the unexposed and thus unhardened portions. Finally, the unprotected areas of layer 66 are etched away to form third and fourth circuit patterns 72, 74 (FIG. 7), after which the remaining portions of photo-resist films 68, 70 are stripped from the board. Patterns 72, 74 are joined to each other and to the first and second circuit patterns by large area through-hole interconnections formed by pads 52a, 54a, sleeves 58 and the superimposed areas of metal layer 66, i.e., pads 72a, 74a and sleeves 76. The first and third circuit patterns also are electrically interconnected by contiguous, overlapped areas 52b, 72b of the respective patterns.

Figure 8:
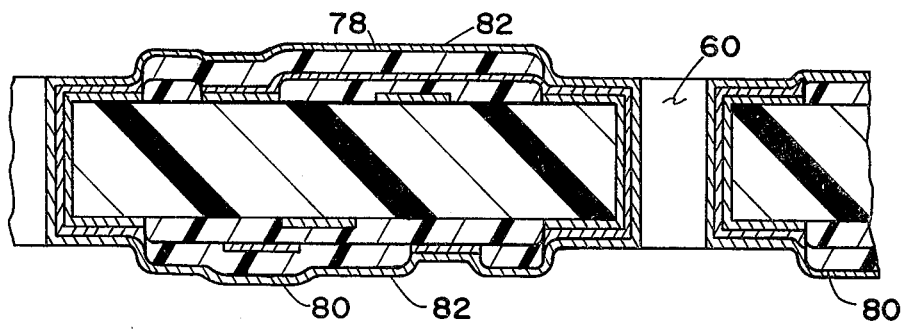
Figure 9:
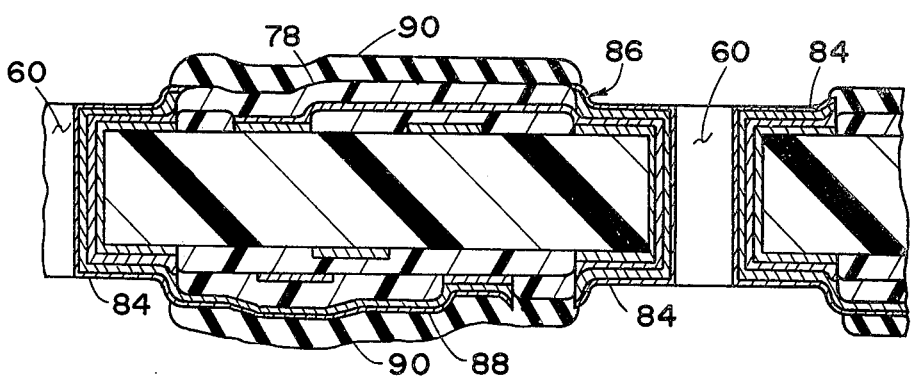

Additional circuit layers are added by repeating the appropriate steps. As in the earlier described embodiment, the final (outermost) circuit patterns preferably include an overlay of a suitable protective metal, such as tin or gold. Thus, by way of illustration, third and fourth patterned insulating layers 78, 80 (FIG. 8) are screen printed on the opposite faces of the board overlying circuit patterns 72, 74 respectively. Through-holes 60 and surrounding pad areas 72a, 74a are left uncovered as before. The entire surface of the body is then copper plated to cover it with a continuous layer 82 of the metal, as shown in FIG. 8. Next, dry resist films are adhered to either face of the structure and exposed to negative light images of the desired circuit patterns. After developing the resist films, protective metal is plated on the uncovered areas of metal layer 82 to provide a thin overlay 84 (FIG. 9). Finally, the remaining photo-resist deposits are removed with a chemical stripping agent and the unprotected portions of the copper layer are etched away to complete the formation of fifth and sixth conductor patterns 86, 88 on the opposite sides of the board. A solder mask 90 is screened on both sides as the final step in the process of fabricating the multilayer circuit board shown in FIG. 9.

As will by now be evident, multilayer circuit boards of the present invention feature large area interconnections between the various circuit layers. In one embodiment, the interconnections take the form of multiple, contiguous nested (i.e. stratiform) metal sleeves lining the board's through-holes. In another embodiment, the interconnections have a substantially rivet- or spool-like form, but likewise are built up of multiple contiguous metal layers deposited within and about the through-holes. It will be understood that the through-holes are formed originally with a diameter sufficiently large to accomodate the number of contiguous layers required to form the completed interconnection and still serve to facilitate the mounting or connection of external components to the board.

While the best mode presently contemplated for practing the invention has been set forth and several embodiments described in detail, it will be appreciated that various changes and modifications other than those specifically mentioned are possible. The appended claims are intended to cover all such variations and modifications as come within the true scope of this invention.

I claim:

1. A method of manufacturing a multilayer circuit board that includes a plurality of superimposed conductor patterns supported on an insulating substrate and interconnected electrically by multilayer metal-lined through-holes, comprising the subsequential steps of:
   (a) providing an insulating substrate having at least one through-hole, a metal sleeve lining said through-hole, and a first conductor pattern on a major surface of the substrate, said pattern including a pad area surrounding an opening of said through-hole and joined to said sleeve,
   (b) applying a permanent coating of an insulating resin to the pattern-bearing surface, leaving said pad and the opening of said through-hole uncovered,
   (c) depositing a continuous layer of metal on the resulting structure, completely covering said coating and any exposed metal surface, including said pad area and sleeve, and
   (d) selectively removing portions of said metal layer to form a second conductor pattern overlying said first pattern and joined to it by a rivet-like multilayer electrical interconnection formed by said pad area, through-hole sleeve and the metal deposited on them in step c).

2. The method of claim 1, wherein said coating is applied by screen stencil printing.

3. The method of claim 1, wherein said selective removal comprises the subsequential steps of:

applying a continuous film of a solid photo-resist material to the deposited metal layer, covering said through-hole opening.

selectively photo-exposing and developing said film to form an etch resist pattern on said layer, etching away portions of the metal layer not protected by said resist pattern, and stripping the etch resist pattern from the board.

4. The method of claim 1, wherein said selective removal comprises the subsequential steps of:

applying a continuous film of a solid photo-resist material to the deposited metal layer, covering said through-hole opening, selectively photo-exposing and developing said film to form on said layer a resist pattern complementary to that of said second conductor pattern and uncover said opening, forming an overlay of a protective metal on the portions of the metal layer not protected by the resist pattern and on the sleeve lining the through-hole, stripping the resist pattern from the board, and etching away portions of the metal layer not overlaid with protective metal to form said second conductor pattern.

5. The method of claim 1, wherein said insulating resin comprises a heat-curable epoxy resin.

6. The method of claim 1, wherein said insulating resin comprises a UV-curable epoxy resin.

7. A method of manufacturing a multilayer circuit board that includes a plurality of metallic conductor patterns supported on opposite surfaces of an insulating substrate and interconnected electrically by stratiform metal-lined through-holes, comprising the subsequential steps of:

providing an insulating substrate having first and second metal conductor patterns on opposite major surfaces thereof, a plurality of holes extending through the substrate and opening within pads included in the patterns, and a metal sleeve lining each through-hole and joined at its opposite ends to said pads, applying a permanent patterned coating of an insulating material to at least one of said substrate surfaces, leaving said pads and through-hole openings uncovered, depositing a continuous layer of metal on the resulting structure, covering said insulating coating, pads and metal sleeve surfaces, and selectively removing portions of said deposited metal layer to form an additional conductor pattern overlying one of said first and second patterns and joined to them by spool-like stratiform electrical interconnections formed by metal deposited on the pads and in the through-hole sleeves.

* * * * *